Feb. 16, 1971 W. S. CORAK ET AL 3,564,353

BULK SEMICONDUCTOR SWITCHING DEVICE FORMED FROM AMPHOROUS GLASS TYPE SUBSTANCE AND HAVING SYMMETRICAL SWITCHING CHARACTERISTICS

Filed April 16, 1969

INVENTORS.
WILLIAM S. CORAK and
DAVID S. HERMAN

By Ernest P. Klipfel
Attorney 3,564,353

BULK SEMICONDUCTOR SWITCHING DEVICE FORMED FROM AMORPHOUS GLASS TYPE SUBSTANCE AND HAVING SYMMETRICAL SWITCHING CHARACTERISTICS

William S. Corak, Arnold, and David S. Herman, Columbia, Md., assignors to Westinghouse Electric Corporation, Pittsburgh, Pa., a corporation of Pennsylvania Filed Apr. 16, 1969, Ser. No. 816,491
Int. Cl. H01l 9/00, 7/00, 3/00
U.S. Cl. 317—234 14 Claims

ABSTRACT OF THE DISCLOSURE

Described are bulk semiconductor switching devices having symmetrical switching characteristics with an associated current controlled negative resistance, and formed from amorphous glass-type substances. The devices of the invention can be readily fabricated on small, integrated circuits and are formed by depositing on a semiconductive substrate successive layers which are subsequently heat treated to form an amorphous semiconductive glass, these layers comprising silicon dioxide, lead oxide and a material selected from the group consisting of chromium-chromium oxide, vanadium-vanadium oxide and molybdenum-molybdenum oxide. Also described is a method for manufacturing such semiconducting glasses.

BACKGROUND OF THE INVENTION

As is known, glass semiconductor threshold switches have been developed which exhibit an avalanche effect when subjected to an electric field whose intensity exceeds a predetermined threshold value. The glass material, which is a bulk-effect semiconductor, does not depend for operation as a switch upon a junction between dissimilar materials. Consequently, junction diffusion steps inherent in the manufacture of conventional transistors for integrated circuits are unnecessary. Additionally, the switches are bidirectional, meaning that only one switch is required where two unidirectional devices with appropriate controls would otherwise be needed. In this respect, glass semiconductor switches have the same current-voltage curve for both positive and negative applied voltages. In the OFF or blocking state, the resistance of the device is in the megohm range. However, when the voltage threshold is exceeded, the device switches very rapidly to a conducting or ON state, in which the dynamic resistance can be as low as 6 to 10 ohms, depending upon the material from which the switch is formed.

Glass semiconductor switches consist, essentially, of an amorphous glass film between two electrodes. When the threshold voltage of such devices is exceeded, a high conductance path between the electrodes is produced. The electric field is established by applying a voltage across the glass film via the electrodes. The field intensity depends upon voltage magnitude and film thickness; but since the thickness in a particular device is fixed, the threshold can be expressed in volts rather than in units of field intensity. The switches are usually made by vacuum-depositing the semiconducting glass.

A large number of materials have heretofore been reported to exhibit a bidirectional symmetrical switching characteristic with current controlled negative resistance. These materials can be divided into two groups depending upon whether they are oxide or non-oxide semiconductors. The oxides have included zinc oxide, niobium oxide, tantalum oxide, titanium oxide, molybdenum oxide, vanadium oxide, copper oxide, chromium oxide and iron oxide. All of these materials can be made to have negative resistance characteristics with varying degrees of success. For example, zinc oxide and other metal oxide powders pressed between metal electrodes will produce a bipolar negative resistance characteristic in which the resistance drops from about 45,000 ohms to nearly 3000 ohms after switching. Niobium oxide has been reported to produce a change in resistivity by a factor of at least 25 to 1 for oxide films formed by anodization or thermal oxidation and having a thickness in the range of about 5 to 10,000 angstrom units. Somewhat similar results can be obtained with films of tantalum and titanium oxide films; however problems of dielectric breakdown are often encountered as compared with niobium oxide films. In the case of molybdenum oxide films prepared by melting $MoO_3$ and $MoO_2$ in various proportions under a nitrogen atmosphere in a quartz tube, the negative resistance effect is reproducibly observed using many contact materials. Again, the current-voltage characteristic is bidirectional and symmetrical with a drop of resistance by a factor of 10 deduced. A large hysteresis effect, however, is noted and the electrical properties depend upon the temperature, electrode separation, and composition. Similar hysteresis effects are noted in the bidirectional and symmetrical negative resistance characteristics of copper oxide and iron oxide. In the case of nickel oxide films, the resistance levels drop from values of 10,000 to 20,000 ohms to a range of 100 to 200 ohms. Switching times in the 0.1 to 10 microsecond range have been reported for such nickel oxide films in the literature. The devices are turned ON by a voltage pulse and OFF by a current pulse. Nickel oxide films, however, have a limited lifetime of about 1000 cycles, after which they fail by remaining in the ON state.

The prior art on switching in the non-oxide materials is not as extensive as in the oxide materials. These non-oxide materials are formed by melting together various proportions of antimony, arsenic, bromine, chlorine, germanium, iodine, phosphorus, selenium, silicon, sulphur, tellurium, and thallium. One or more of these materials are mixed together in a batch, melted, and then quenched to produce what is usually referred to as a chalcogenide glass. For example, a mixture of arsenic, tellurium and iodine, when melted and quenched, has a symmetrical switching characteristic with an associated negative resistance effect, the high resistance state being on the order of $10^5$ to $10^6$ ohms and the low resistance state being on the order of $10^2$ to $10^3$ ohms. In the high resistance state, the material appears to be glassy or amorphous. However, it appears that as the switching proceeds, thermal breakdown and melting occur, leading to an onset of crystallization of the material which is believed to cause the low-resistance state. The switching time varies directly as a function of thickness and inversely as a function of temperature. Thin specimens switch rapidly, in less than a millisecond; whereas thicker specimens take several seconds to switch. A voltage pulse of amplitude high enough for the material to enter the negative resistance region causes the material to go from the high to the low resistance state by melting and crystallization. Switching from the low to the high resistance state is accomplished by a current pulse of amplitude greater than the current flow which has originally caused the specimens to switch to the low resistance state. When the current pulse is suddenly switched off, the material cools rapidly to the glassy high-resistance state.

Other types of chalcogenide glasses are described, for example in Ovshinsky Pat. No. 3,271,591 wherein a number of different theories for the switching action is given. A typical composition of the semiconducting glasses described in the Ovshinsky patent in percentages of atomic weight is 47.7% tellurium, 29.9% arsenic, 12.64% silicon and 9.76% germanium. One difficulty with such chalcogenide glasses, however, is that they are not particularly adapted for use in integrated circuit applications.

SUMMARY OF THE INVENTION

As one object, the present invention seeks to provide a new and improved bidirectional symmetrical switching device formed from amorphous bulk-type semiconductive glass.

Another object of the invention is to provide a bulk-type switching device of the type described which is compatible with, and can be easily incorporated into integrated semiconductor circuits.

Still another object of the invention is to provide a method for forming a bulk-type semiconductor switch of the type described herein.

In accordance with the invention, a bulk-type semiconductor switch is provided comprising a substrate, preferably a single crystal silicon wafer, having successive layers of silicon dioxide, lead oxide and a chromium-chromium oxide layer deposited thereon, the layers being heat treated to form a ternary oxide system having the properties of a semiconducting glass.

As a substitute for the chromium-chromium oxide layer, vanadium-vanadium oxide or molybdenum-molybdenum oxide layers can be substituted; while substrates such as quartz or sapphire, rather than silicon, can be used as the surface on which the semiconducting glass is formed.

In the manufacture of one embodiment of the switch of the invention, a single crystal silicon slice of the desired resistivity and type with a polished surface or epitaxial layer can be used as the substrate. Silicon dioxide is thermally grown on the substrate normally using a high temperature oxidation process. Thereafter, a constant amount of lead oxide is deposited onto the wafer by vacuum deposition techniques. The wafer with layers of silicon dioxide and lead oxide deposited thereon is then heat treated in an air ambient to form a plumbate glass, following which the glass is annealed. In a subsequent evaporation, chromium is deposited onto the plumbate glass surface. Since chromium getters oxygen rather rapidly, a chromium-chromium oxide layer is formed. Finally, the wafer with the three layers deposited thereon is heat treated in an air ambient, this heat treatment having the effect of producing more chromium oxide. The final step in the process is the evaporation of an aluminum film as one electrode for the switch, the other electrode being the low-resistivity silicon substrate. After each evaporation step, individual devices can be delineated on the wafer using standard photoengraving techniques.

The above and other objects and features of the invention will become apparent from the following detailed description taken in connection with the accompanying drawings which form a part of this specification, and in which.

Figure 1:
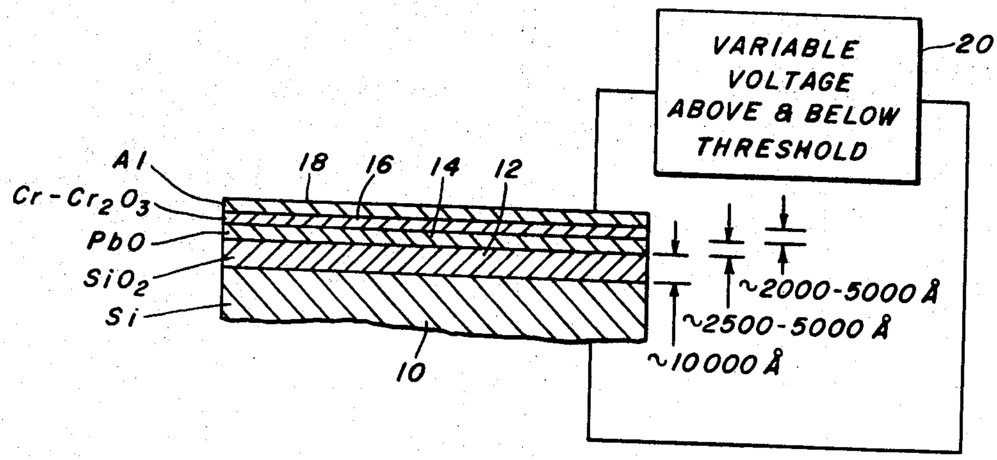
FIG. 1 is a cross-sectional view of a typical bidirectional switch formed in accordance with the teachings of the invention.

With reference now to the drawings, and particularly to FIG. 1, one embodiment of the bulk semiconductor switching device of the present invention is shown and comprises a wafer of silicon 10 having successive layers of silicon dioxide 12, lead oxide 14 and a chromium-chromium oxide layer 16 deposited thereon in a manner hereinafter described. Covering the chromium-chromium oxide layer is a layer of aluminum 18 forming one electrode for connection to a voltage source 20, the other side of the voltage source being connected to the silicon wafer 10 such that the final device is in the form of a capacitor or diode with low resistivity silicon as one electrode and the aluminum film 18 as the other.

As shown in FIG. 1, the silicon dioxide layer, in a typical embodiment of the invention, is about 10,000 angstrom units thick; the lead oxide film is about 2500 to 5000 angstrom units thick, and the chromium-chromium oxide layer is about 2000 to 5000 angstrom units thick. While the layers 12 through 16 are shown as discrete layers in FIG. 1, it will be understood that in actual practice the layers, through a series of heat treatments, are probably fused together to provide a degree of homogeneity. However, the actual degree of homogeneity has not been determined.

Figure 2:
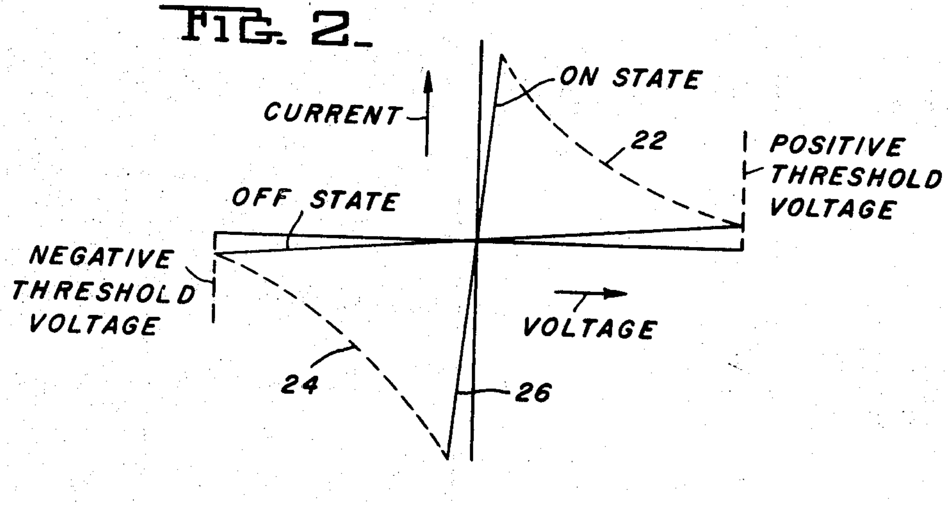
FIG. 2 is a plot of voltage versus current showing the negative resistance switching characteristics of the device of FIG. 1.

The switching characteristics of the devices of the invention are shown in FIG. 2. An insulating, or semiconducting, OFF state exists on either side of zero voltage until a threshold voltage is reached in either the positive or negative direction, where switching occurs. In this region (i.e., the OFF state) the device may have a resistance of the order of megohms. When the threshold voltage is reached or exceeded, the device rapidly goes through a negative resistance region identified by the broken lines 22 and 24 in FIG. 2, whereupon the voltage decreases until the device reaches a conducting or metallic ON state. In the ON state, the current can be varied along line 26; and the device will remain in the ON state just so long as a small holding current, on the order of about 0.5 milliampere, is maintained. Of course, once the voltage is removed from the device, the voltage must then be raised to the threshold value before the device will again switch.

The reason for the switching effect shown in FIG. 2 is not entirely understood; however various theories have been developed. For example, one theory is based on the mechanism of thermal breakdown. Under this theory, the negative resistance effect occurs when the high-resistance glassy state breaks down due to Joule heating, and becomes a low-resistance crystalline state with the switching occurring at a slow speed. Another theory involves a double injection of carriers into an insulator. Under this theory, it is assumed that it is possible to treat the properties of amorphous materials by applying the energyband concept obtained from the periodic field approach as applied to crystalline structures. This assumption about amorphous dielectric materials leads to the conclusion that they have valence and conduction bands widely separated by a forbidden region. The forbidden energy region may or may not contain an appreciable number of impurities or trapping energy levels which can contribute to conduction.

Figure 3:
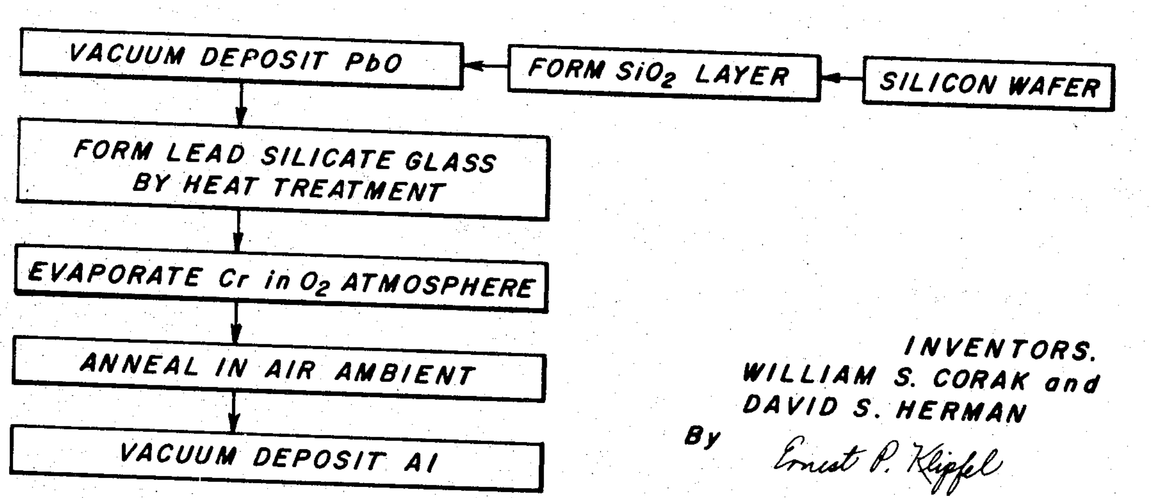
FIG. 3 is a flow diagram showing the steps in the manufacture of the device of FIG. 1.

The fabrication of the device of FIG. 1 is completely compatible with integrated circuit processing (see FIG. 3). The first two steps are common to all integrated circuits produced by planar technology. That is, a single crystal silicon slice 10 of the desired resistivity and type with a polished surface or epitaxial layer is used as the substrate. Silicon dioxide is then thermally grown on the substrate, normally using a high-temperature oxidation process in accordance with conventional techniques. This silicon dioxide layer typically has a thickness of about 10,000 angstrom units. Following the formation of the silicon dioxide layer 12, the lead oxide layer 14 is formed by vacuum deposition techniques wherein lead oxide is boiled in a vacuum and deposited onto the substrate to form a layer having a thickness of about 2500 to 5000 angstrom units. Following the deposition of the lead oxide layer 14, a lead silicate glass is formed by heat treatment of the sample in an air ambient, typical conditions being a temperature of 400–600° C. for 30 minutes. In this process, it is noted that the color of the lead oxide changes from yellow to brown.

The next step in the process is to evaporate chromium in an oxygen atmosphere to form a layer 16 having a thickness of about 2000 to 5000 angstrom units. In this process, chromium oxide is at least partially formed;

and after evaporation of the chromium, the chromium or chromium-chromium oxide plumbate glass mixture is heat treated to a temperature of about 450° C. for 30 minutes in an air ambient, during which time further chromium oxide is probably formed. The final step consists of evaporating the aluminum film 18 as the counter-electrode. After each evaporation step, devices can be delineated using standard photoengraving techniques. The final device is in the form of a capacitor or diode shown in FIG. 1 with low resistivity silicon as one electrode and aluminum as the other, the actual amorphous semiconducting material being sandwiched between the two electrodes. Devices of this type have a resistance in the OFF state of approximately 1 megohm and a resistance in the ON state of only 100 ohms.

As a substitute for the silicon substrate, quartz or sapphire can be used as the surface on which the semiconducting glass film is formed. In this case, the silicon dioxide film must be formed by vacuum deposition or sputtering techniques. It appears that the most important material in the system is the chromium-chromium oxide layer; and it appears that for best results, this layer should have a thickness of about 5000 angstrom units. As a substitute for this material, however, vanadium-vanadium oxide and molybdenum-molybdenum oxide layers may be utilized.

Although the invention has been shown in connection with certain specific embodiments, it will be readily apparent to those skilled in the art that various changes in form, arrangement of parts and method steps may be made to suit requirements without departing from the spirit and scope of the invention.

We claim as our invention:

1. A bulk semiconductor switching device comprising a substrate of low resistivity material, successive layers of silicon dioxide and lead oxide formed on said substrate, and a third layer of material containing an oxide selected from the group consisting of chromium oxide, vanadium oxide and molybdenum oxide deposited on said lead oxide layer, the layers being heat treated to form a ternary oxide system having the properties of a semiconducting glass.

2. The switching device of claim 1 including a layer of metal deposited on said third layer whereby said layer of metal and said substrate form contacts for connection to a source of potential.

3. The switching device of claim 2 including a source of potential connected to said contacts, the magnitude of said potential being sufficient to exceed the threshold potential of said bulk semiconductor switching device.

4. The switching device of claim 1 wherein said substrate is selected from the group consisting of silicon, sapphire, and quartz.

5. The switching device of claim 1 wherein said substrate comprises a wafer of single crystal silicon.

6. The switching device of claim 1 wherein said third layer comprises a mixture of chromium and chromium oxide.

7. The switching device of claim 1 wherein said silicon dioxide layer has a thickness of about 10,000 angstrom units, said lead oxide layer has a thickness of about 2500 to 5000 angstrom units and said third layer has a thickness of about 2000 to 5000 angstrom units.

8. In the method for manufacturing a bulk semiconductor switching device, the steps of forming on the surface of a substrate of low electrical resistivity a first layer of silicon dioxide, depositing on said first layer a second layer of lead oxide, heat treating the substrate and the first and second layers to form a lead silicate glass, forming on the surface of the second layer a third layer of material selected from the group consisting of chromium-chromium oxide, vanadium-vanadium oxide and molybdenum-molybdenum oxide, and finally heat treating the substrate with the third layer deposited thereon.

9. The method of claim 8 wherein said substrate is silicon and said first layer of silicon dioxide is formed by an oxidation process.

10. The method of claim 8 wherein said substrate is a material selected from the group consisting of sapphire and quartz and said first layer of silicon dioxide is formed by vapor deposition.

11. The method of claim 8 wherein said substrate is a material selected from the group consisting of sapphire and quartz and said first layer silicon dioxide is formed by sputtering.

12. The method of claim 8 wherein the heat treatment of the first and second layers is carried out in an air ambient at a temperature in the range of about 400–600° C. for 30 minutes.

13. The method of claim 8 wherein the final heat treatment is carried out at a temperature of about 450° C. for 30 minutes in an air ambient.

14. The method of claim 8 wherein said third layer is evaporated onto said second layer in an oxygen atmosphere.

References Cited

UNITED STATES PATENTS

| | | | |
|---|---|---|---|
| 3,491,000 | 1/1970 | Fuls et al. | 204—38 |
| 3,440,588 | 4/1969 | Drake et al. | 338—20 |
| 3,500,145 | 3/1970 | Hitchcock | 317—238 |
| 3,418,619 | 12/1968 | Lightly | 338—20 |
| 3,271,591 | 9/1966 | Ovshinsky | 307—88.5 |
| 3,447,958 | 6/1969 | Okutsu et al. | 117—201 |
| 3,498,930 | 3/1970 | Shanefield | 252—512 |
| 3,448,425 | 6/1969 | Shanefield | 338—20 |
| 3,397,446 | 8/1968 | Sharp | 29—570 |

JOHN W. HUCKERT, Primary Examiner

M. H. EDLOW, Assistant Examiner

U.S. Cl. X.R.

117—217; 307—284; 317—235, 238; 338—20